US006304471B1

United States Patent
Chalasani et al.

(10) Patent No.: US 6,304,471 B1
(45) Date of Patent: Oct. 16, 2001

(54) SYSTEM AND METHOD FOR ASSESSING A CAPACITY OF A BACKUP BATTERY AND POWER PLANT INCORPORATING THE SAME

(76) Inventors: Subhas Chandra Chalasani, 4417 Brigade Ct., Plano, TX (US) 75024; Vijayan Joseph Thottuvelil, 3328 Russell Cir., Plano, TX (US) 75023

( * ) Notice: Subject to any disclaimer, the term of this patent is extended or adjusted under 35 U.S.C. 154(b) by 0 days.

(21) Appl. No.: 09/324,753

(22) Filed: Jun. 3, 1999

(51) Int. Cl.[7] ............... H02M 5/42; H02J 7/00; G01N 27/416
(52) U.S. Cl. ............... 363/84; 320/132; 324/427
(58) Field of Search ............... 363/84, 37; 324/427; 320/30, 35, 39, 48, 128, 14, 116, 118, 140, 22, 23, 132, 134

(56) References Cited

U.S. PATENT DOCUMENTS 4,952,862  *  8/1990  Biagetti et al. ............... 320/48

* cited by examiner

*Primary Examiner*—Peter S. Wong
*Assistant Examiner*—Rajnikant D. Patel

(57) ABSTRACT

For use with a power plant having a rectifier and a backup battery coupled to a variable load, a system for, and method of, assessing a capacity of the backup battery. In one embodiment, the system includes: (1) a controller, coupled to the rectifier, that controls an output current of the rectifier to maintain a discharge current of the backup battery at a substantially constant level and (2) a voltage sensor, coupled to the backup battery, that measures a voltage of the backup battery.

21 Claims, 1 Drawing Sheet

SYSTEM AND METHOD FOR ASSESSING A CAPACITY OF A BACKUP BATTERY AND POWER PLANT INCORPORATING THE SAME

TECHNICAL FIELD OF THE INVENTION

The present invention is directed, in general, to power plants and, more specifically, to a system and method for assessing the capacity of a backup battery in a power plant and a power plant employing the system or method.

BACKGROUND OF THE INVENTION

The traditional reliability of telecommunication systems that users have come to expect and rely upon is based in part on the systems' operation with redundant equipment and power supplies. Telecommunication switching systems, for example, route tens of thousands of calls per second. The failure of such systems, due to either equipment breakdown or loss of power, is unacceptable since it would result in a loss of millions of telephone calls and a corresponding loss of revenue.

Power plants, such as battery plants, address the power loss problem by providing the system with an energy reserve, a backup battery, in the event of the loss of primary power to the system. A battery plant generally operates as follows. The battery plant generally includes a number of backup batteries, rectifiers and other power distribution equipment. The primary power is produced by the rectifiers, which convert an AC mains voltage into a DC voltage to power the load equipment and to charge the backup batteries. The primary power may, however, become unavailable due to an AC power outage or the failure of one or more of the rectifiers. In either case, the backup batteries then provide power to the load. Redundant rectifiers and backup batteries may be added to the battery plant as needed to increase the availability of the battery plant.

A battery plant that powers telecommunications systems such as transmission and switching systems in wireless base stations commonly employs valve-regulated lead-acid (VRLA) batteries as the energy reserve. The backup batteries are typically coupled directly to the output of the rectifiers and may instantly provide power to the load in the event the AC power outage occurs. During normal operation, the backup batteries are usually maintained in a fully charged state to maximize a duration for which the backup batteries can provide energy to the load equipment.

As a backup battery ages, its capacity or energy-storage capability decreases, reducing the duration for which the backup battery can provide energy, even when fully charged. In many telecommunications applications, a backup battery is considered to have failed when its actual capacity has fallen below a threshold, such as 80% of its rated capacity. A failed backup battery should be replaced in an orderly fashion to maintain the availability of the battery plant. It is crucial, therefore, to be able to assess whether the capacity of a particular backup battery has fallen below the threshold.

The capacity of a backup battery may be assessed when the backup battery is on-line or off-line. One straightforward approach is to take the backup battery off-line and couple it to a dissipative-resistive load. The load can then completely discharge the backup battery at a constant current thus providing an accurate indication of the backup battery's capacity. The off-line method, however, requires that the backup battery be temporarily removed from the battery plant, decreasing the availability thereof. Therefore, to maintain the battery plant at the desired availability level, the capacity of the backup battery should be assessed on-line.

The complete discharge method, however, has some major disadvantages. If an AC power outage occurs during or after the discharge test, but before the backup battery has been fully recharged, the full energy reserve provided by the backup battery will not be available, thus jeopardizing the availability of the battery plant and the reliability of the telecommunications system powered thereby. Further, since a backup battery may only be charged and discharged a finite number of times, each cycle of complete discharge and charge necessarily reduces the overall life span of the battery.

Accordingly, what is needed in the art is a system and method for assessing the capacity of a backup battery that provides an accurate measurement of the backup battery's capacity yet maintains the availability of the battery plant at a satisfactory level.

SUMMARY OF THE INVENTION

To address the above-discussed deficiencies of the prior art, the present invention provides, for use with a power plant having a rectifier and a backup battery coupled to a variable load, a system for, and method of, assessing a capacity of the backup battery. In one embodiment, the system includes: (1) a controller, coupled to the rectifier, that controls an output current of the rectifier to maintain a discharge current of the backup battery at a substantially constant level and (2) a voltage sensor, coupled to the backup battery, that measures a voltage of the backup battery.

The present invention therefore introduces the broad concept of employing a rectifier to supply varying amounts of current to a varying load to allow a backup battery to maintain a substantially constant discharge current. Maintaining the discharge current of the backup battery at a substantially constant level allows an accurate assessment of the backup battery's capacity.

In one embodiment of the present invention, the controller senses the discharge current of the backup battery. Alternatively, the controller can sense the output current of the rectifier and a current draw of the load. Either embodiment allows the discharge current of the battery to be determined and held substantially constant during the time the backup battery is being capacity-tested (the "assessment interval").

In one embodiment of the present invention, the controller maintains the discharge current of the backup battery at the substantially constant level until the charge of the backup battery decreases by a predetermined discharge amount. While suitable for determining capacity, it is disadvantageous to discharge a backup battery completely, since it compromises the availability of the backup battery in the event of an AC power outage. An embodiment of the present invention avoids this disadvantage by discharging the backup battery only by a predetermined amount, which may be expressed in terms of a percentage of the backup battery's full charge level. In a specific embodiment of the present invention, the predetermined discharge amount is about 20% of the full charge level of the backup battery.

In one embodiment of the present invention, the capacity is a function of the voltage of the backup battery at a termination of a predetermined assessment interval. Representative capacity graphs will be set forth in the Detailed Description that follows to illustrate how the voltage of the backup battery at a termination of a predetermined assessment interval can be employed to determine the capacity of the backup battery.

In one embodiment of the present invention, the predetermined assessment interval spans at least 20 minutes. Those skilled in the pertinent art will understand, however, that the predetermined assessment interval may be shorter or longer than 20 minutes.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

While many methods have been proposed for on-line assessment of the capacity of a backup battery, methods involving impedance or conductance measurements may be subject to a number of accuracy and repeatability problems. A more accurate method for assessing the capacity of the backup battery is to discharge the backup battery while it is connected on-line. A complete or partial discharge at a constant current may provide a relatively accurate measurement of the backup battery's capacity. By monitoring both the amount of current supplied and the time required to discharge the backup battery, the total energy delivered by the backup battery, measured in ampere-hours, may be determined.

Figure 1:
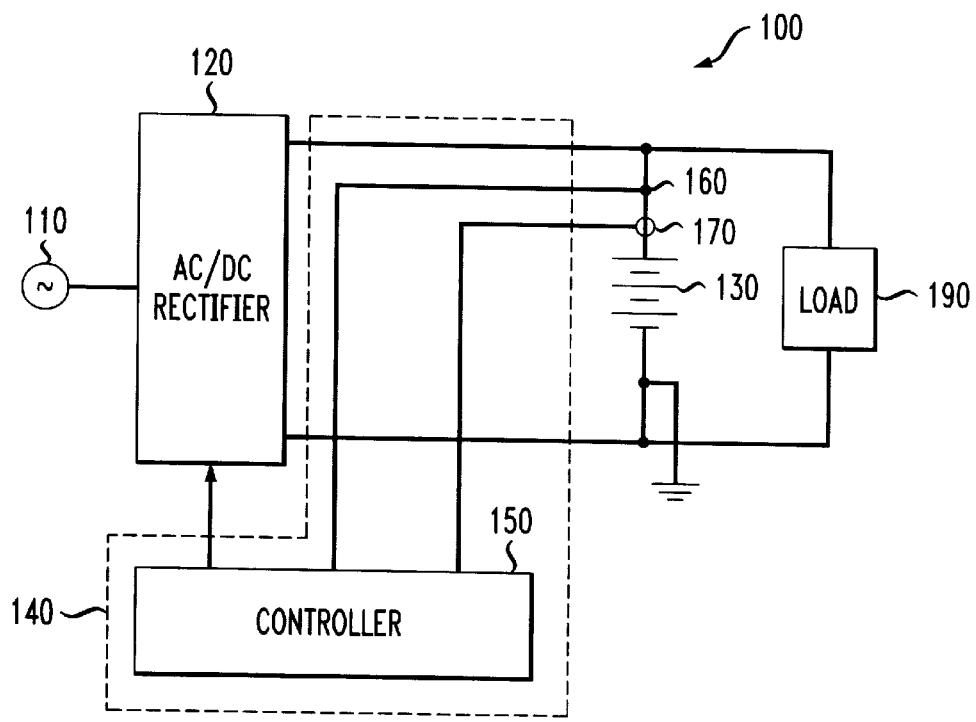
FIG. 1 illustrates a simplified schematic diagram of an embodiment of a power plant constructed in accordance with the principles of the present invention.

Referring initially to FIG. 1, illustrated is a simplified schematic diagram of an embodiment of a power plant 100 constructed in accordance with the principles of the present invention. The power plant 100 is coupled to a source of AC power 110 and provides DC power to a load 190. The power plant 100 is employable to power variable loads (i.e., loads having variable current draw) such as wireless base station equipment. The current draw of the load 190 may vary, for example, as a function of an amount of voice traffic carried by the base station.

The power plant 100 includes a rectifier 120 coupled to the source 110. Those skilled in the pertinent art realize, of course, that the power plant 100 may include a number of parallel-coupled rectifiers 120, depending on the power requirements of the load 190. The power plant 100 further includes a backup battery 130 coupled to an output of the rectifier 120. Of course, additional backup batteries 130 may be added as necessary to increase the availability of the power plant 100. The battery 130 may be a VRLA battery or any other type of battery, whether conventional or later-developed, that experiences a decrease in capacity over its lifetime.

The power plant 100 still further includes a system 140 for assessing a capacity of the backup battery 130. The system 140 includes a controller 150, coupled to the rectifier 120, that, during the assessment interval, controls an output current of the rectifier 120 to maintain a discharge current of the backup battery 130 at a substantially constant level. In the illustrated embodiment, the controller 150 controls the output current of the rectifier 120 by adjusting an output voltage of the rectifier 120 relative to the voltage of the backup battery 130. The system 140 further includes a voltage sensor 160, coupled to the backup battery 130, that measures a voltage of the backup battery 130.

The capacity of the backup battery 130 and its charge level determines a duration for which the backup battery 130 can provide energy. As the backup battery 130 ages, however, its capacity decreases, reducing the duration for which the backup battery 130 can provide energy, even when fully charged. The system 140, therefore, advantageously detects when the actual capacity of the backup battery 130 has diminished beyond a threshold, such as 80% of its rated capacity. The backup battery 130 may then be considered to have failed and should be replaced to maintain the power plant 100 at the desired level of availability.

The system 140 operates as follows. In the illustrated embodiment, the controller 150 employs a current sensor 170 to sense the discharge current of the backup battery 130. Alternatively, the controller 150 can sense both the output current of the rectifier 120 and a current draw of the load 190 and derive therefrom the discharge current of the backup battery 130. Either method allows the discharge current of the backup battery 130 during the assessment interval to be determined.

The controller 150 is coupled to the rectifier 120. In one embodiment, the controller 150 adjusts a reference voltage of the rectifier 120 to increase or decrease the output voltage of the rectifier 120 relative to the voltage of the backup battery 130. By varying the output voltage of the rectifier 120, the controller 150 may control the output current of the rectifier 120 and, indirectly, the discharge current of the backup battery 130. The rectifier 120 may thus supply a varying amount of current to the load 190, allowing the backup battery 130 to maintain a substantially constant discharge current.

In the illustrated embodiment, the controller 150 maintains the discharge current of the backup battery 130 at the substantially constant level for a predetermined assessment interval. The predetermined assessment interval may span, for example, 20 minutes. At the end of the predetermined assessment interval, the voltage sensor 160 measures the voltage of the backup battery 130. The capacity of the backup battery 130 may then be determined with reference to a capacity graph to be illustrated and described with respect to FIG. 2.

The predetermined assessment interval is preferably selected such that, with the discharge current of the backup battery 130 at the substantially constant level, the charge of the backup battery 130 will decrease by a predetermined discharge amount during the predetermined assessment interval. In the illustrated embodiment, the predetermined assessment interval and the level of the discharge current of the backup battery 130 may be correlated such that the predetermined discharge amount is about 20% of a full charge level of the backup battery 130. The backup battery 130 may thus retain an adequate amount of energy for powering the load 190 in the event that an AC power outage occurs during or after the discharge test, but before the backup battery 130 has been fully recharged.

Figure 2:
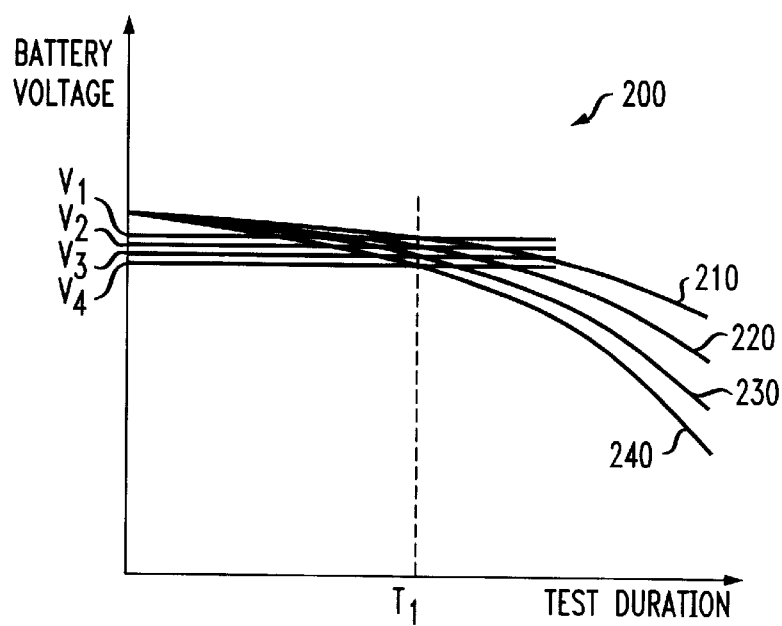
FIG. 2 illustrates a representative capacity graph of backup battery voltages with respect to time.

Turning now to FIG. 2, illustrated is a representative capacity graph 200 of backup battery voltages with respect to time. The graph 200 includes a first, second, third and fourth voltage curves 210, 220, 230, 240 representative of backup batteries of 100%, 90%, 80% and 70% capacities, respectively. The graph 200 further includes a number of voltage levels V1, V2, V3, V4. In the illustrated embodiment, the voltage curves 210, 220, 230, 240 are presented with respect to a predetermined assessment interval T1. Of course, other assessment intervals longer or shorter than the predetermined assessment interval Ti may be employed. The capacity graph 200 may be developed, for example, by completely discharging a number of backup batteries of varying capacities at a certain substantially constant level of current and recording the voltage of the backup batteries with respect to time for at least the predetermined assessment interval T1.

With continuing reference to FIG. 1, the controller 150 may discharge the backup battery 130 at the substantially constant level for the predetermined assessment interval T1. At the termination of the predetermined assessment interval T1, the voltage of the backup battery 130 is measured by the voltage sensor 170.

By comparing the voltage of the backup battery 130 to the voltage levels V1, V2, V3, V4, the capacity of the backup battery 130 may be determined. For example, a voltage equal to or exceeding voltage level V2 implies that the backup battery 130 likely has at least 90% of its rated capacity. A voltage less than voltage level V3, however, implies that the backup battery 130 is likely to have less than 80% of is rated capacity. The capacity of the backup battery 130 may then be compared to a threshold level to determine whether the backup battery 130 has failed. A failed backup battery 130 can then be replaced to maintain the availability of the power plant 100 at the desired level.

Although the present invention has been described in detail, those skilled in the art should understand that they can make various changes, substitutions and alterations herein without departing from the spirit and scope of the invention in its broadest form.

What is claimed is:

1. For use with a power plant having a rectifier and a backup battery coupled to a variable load, a system for assessing a capacity of said backup battery, comprising:
   a controller, coupled to said rectifier, that controls an output current of said rectifier to maintain a discharge current of said backup battery at a substantially constant level; and
   a voltage sensor, coupled to said backup battery, that measures a voltage of said backup battery, said system comparing said voltage to a set of reference voltage levels and determining an actual capacity of said backup battery therefrom.

2. The system as recited in claim 1 wherein said controller senses said discharge current of said backup battery.

3. The system as recited in claim 1 wherein said controller senses said output current of said rectifier and a current draw of said load.

4. The system as recited in claim 1 wherein said controller maintains said discharge current of said backup battery at said substantially constant level until a charge of said backup battery decreases by a predetermined discharge amount.

5. The system as recited in claim 4 wherein said predetermined discharge amount is about 20% of a full charge level of said backup battery.

6. The system as recited in claim 1 wherein said capacity is a function of said voltage of said backup battery at a termination of a predetermined assessment interval.

7. The system as recited in claim 6 wherein said predetermined assessment interval spans at least 20 minutes.

8. For use with a power plant having a rectifier and a backup battery coupled to a variable load, a method of assessing a capacity of said backup battery, comprising:
   controlling an output current of said rectifier to maintain a discharge current of said backup battery at a substantially constant level;
   measuring a voltage of said backup battery; and
   comparing said voltage to a set of reference voltage levels and determining an actual capacity of said backup battery therefrom.

9. The method as recited in claim 8 further comprising sensing said discharge current of said backup battery.

10. The method as recited in claim 8 further comprising sensing said output current of said rectifier and a current draw of said load.

11. The method as recited in claim 8 wherein said controlling comprises maintaining said discharge current of said backup battery at said substantially constant level until a charge of said backup battery decreases by a predetermined discharge amount.

12. The method as recited in claim 11 wherein said predetermined discharge amount is about 20% of a full charge level of said backup battery.

13. The method as recited in claim 8 wherein said capacity is a function of said voltage of said backup battery at a termination of a predetermined assessment interval.

14. The method as recited in claim 13 wherein said predetermined assessment interval spans at least 20 minutes.

15. A power plant, comprising:
   a rectifier coupled to a variable load;
   a backup battery coupled to said variable load; and
   a system for assessing a capacity of said backup battery, including:
      a controller, coupled to said rectifier, that controls an output current of said rectifier to maintain a discharge current of said backup battery at a substantially constant level, and
      a voltage sensor, coupled to said backup battery, that measures a voltage of said backup battery, said system comparing said voltage to a set of reference voltage levels and determining an actual capacity of said backup battery therefrom.

16. The power plant as recited in claim 15 wherein said controller senses said discharge current of said backup battery.

17. The power plant as recited in claim 15 wherein said controller senses said output current of said rectifier and a current draw of said load.

18. The power plant as recited in claim 15 wherein said controller maintains said discharge current of said backup battery at said substantially constant level until a charge of said backup battery decreases by a predetermined discharge amount.

19. The power plant as recited in claim 18 wherein said predetermined discharge amount is about 20% of a full charge level of said backup battery.

20. The power plant as recited in claim 15 wherein said capacity is a function of said voltage of said backup battery at a termination of a predetermined assessment interval.

21. The power plant as recited in claim 20 wherein said predetermined assessment interval spans at least 20 minutes.

* * * * *